United States Patent
Wu et al.

(10) Patent No.: US 7,919,788 B2
(45) Date of Patent: Apr. 5, 2011

(54) ASSEMBLY OF A HEAT DISSIPATING BASE AND A LEAD FRAME FOR A LIGHT EMITTING DIODE PACKAGING DEVICE AND METHOD FOR MAKING THE SAME

(75) Inventors: Chia-Hao Wu, Taipei (TW); Chen-Hsiu Lin, Taipei (TW)

(73) Assignee: Lite-On Technology Corp., Taipei (TW)

( * ) Notice: Subject to any disclaimer, the term of this patent is extended or adjusted under 35 U.S.C. 154(b) by 392 days.

(21) Appl. No.: 11/984,339

(22) Filed: Nov. 16, 2007

(65) Prior Publication Data

US 2009/0078958 A1 Mar. 26, 2009

(30) Foreign Application Priority Data

Sep. 21, 2007 (TW) ............................... 96135413 A

(51) Int. Cl.
*H01L 33/00* (2010.01)
(52) U.S. Cl. .................. 257/99; 257/E33.058
(58) Field of Classification Search .................. 257/99, 257/676, 100; 362/296.05, 341–350
See application file for complete search history.

(56) References Cited

U.S. PATENT DOCUMENTS

| | | | |
|---|---|---|---|
| 3,942,141 A * | 3/1976 | Kaffenberger | 333/254 |
| 6,274,924 B1 * | 8/2001 | Carey et al. | 257/676 |
| 7,161,189 B2 * | 1/2007 | Wu | 257/98 |
| 7,170,151 B2 * | 1/2007 | Elpedes et al. | 257/676 |
| 7,361,940 B2 * | 4/2008 | Kim et al. | 257/99 |
| 2006/0180824 A1 * | 8/2006 | Kim et al. | 257/99 |
| 2006/0273338 A1 * | 12/2006 | Lee et al. | 257/99 |
| 2008/0149962 A1 * | 6/2008 | Kim et al. | 257/99 |
| 2009/0189178 A1 * | 7/2009 | Kim et al. | 257/99 |

* cited by examiner

*Primary Examiner* — Kiesha R Bryant
*Assistant Examiner* — Mark W Tornow
(74) *Attorney, Agent, or Firm* — Rosenberg, Klein & Lee

(57) ABSTRACT

A light emitting diode packaging device includes: a heat dissipating base; a light emitting dice mounted on the heat dissipating base; a lead frame coupled electrically to the light emitting dice and having a protruding wall defining a confining space for extension of a protruding part of the heat dissipating base therethrough; at least one retaining member provided on one of the protruding part of the heat dissipating base and the protruding wall of the lead frame to retain the lead frame to the heat dissipating base; and a molding material molded on the heat dissipating base and the lead frame.

19 Claims, 4 Drawing Sheets

US 7,919,788 B2

ASSEMBLY OF A HEAT DISSIPATING BASE AND A LEAD FRAME FOR A LIGHT EMITTING DIODE PACKAGING DEVICE AND METHOD FOR MAKING THE SAME

CROSS-REFERENCE TO RELATED APPLICATION

This application claims priority of Taiwanese Application No. 096135413, filed on Sep. 21, 2007.

BACKGROUND OF THE INVENTION

1. Field of the Invention

The invention relates to an assembly of a heat dissipating base and a lead frame for a light emitting diode packaging device and a method for making the same, more particularly to an assembly including a lead frame connected firmly to a heat dissipating base through at least one retaining member.

2. Description of the Related Art

Recent developments have resulted in improved luminance and power performance for light emitting diodes (LEDs). However, for high power LEDs, the working current can be as high as 330 mA to 1 A, which can generate enormous heat therein, which, in turn, results in an adverse effect on the service life of the LEDs.

FIG. 1 illustrates a conventional high power LED packaging device that includes a heat dissipating base 12 made of copper, an LED dice 1, a lead frame 13, a molding material 15 and a lens 14. The conventional LED packaging device 1 is prepared by adhesively attaching the LED dice 11 to the heat dissipating base 12 using a silver epoxy adhesive, placing the lead frame 13 in a mold (not shown), forming the molding material 15 through injection molding techniques so as to bond adhesively the lead frame 13 to the molding material 15, fitting the heat dissipating base 12 into a confining wall 151 of the molding material 15, connecting the LED dice 11 to the lead frame 13 through wire bonding techniques so as to permit connection to a circuit board (not shown), and covering a space above the LED dice 11 using the lens 14. However, since the heat dissipating base 12 is secured to the molding material 15 in a press fit manner, the heat dissipating base 12 tends to loosen therefrom, thereby resulting in poor heat dissipation and a reduction in the service life of the conventional LED packaging device 1.

SUMMARY OF THE INVENTION

Therefore, the object of the present invention is to provide a light emitting diode packaging device that can overcome the aforesaid drawback associated with the prior art.

Another object of the present invention is to provide an assembly of a heat dissipating base and a lead frame for the light emitting diode packaging device.

Yet another object of the present invention is to provide a method for making the assembly of the heat dissipating base and the lead frame.

According to one aspect of this invention, there is provided a light emitting diode packaging device that comprises: a heat dissipating base having a dice-mounting surface and a protruding part protruding therefrom; a light emitting dice mounted on the dice-mounting surface of the heat dissipating base; a lead frame coupled electrically to the light emitting dice and having a base wall formed with a through-hole for extension of the protruding part of the heat dissipating base therethrough, and a protruding wall protruding from a periphery of the through-hole and defining a confining space for extension of the protruding part of the heat dissipating base therethrough; at least one retaining member provided on one of the protruding part of the heat dissipating base and the protruding wall of the lead frame to retain the lead frame to the heat dissipating base; and a molding material molded on the heat dissipating base and the lead frame.

According to another aspect of this invention, there is provided a method for making an assembly of a heat dissipating base and a lead frame of a light emitting diode packaging device. The method comprises: (a) preparing a heat dissipating base having a protruding part protruding therefrom; (b) punching a metal sheet into a lead frame that has a base wall formed with a through-hole, and a protruding wall protruding from a periphery of the through-hole and defining a confining space; (c) inserting the protruding part of the heat dissipating base into and through the confining space defined by the protruding wall of the lead frame and retaining the lead frame to the heat dissipating base through at least one retaining member; and (d) molding the lead frame and the heat dissipating base so as to form a molding material enclosing the protruding wall of the lead frame and an end portion of the protruding part of the heat dissipating base.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
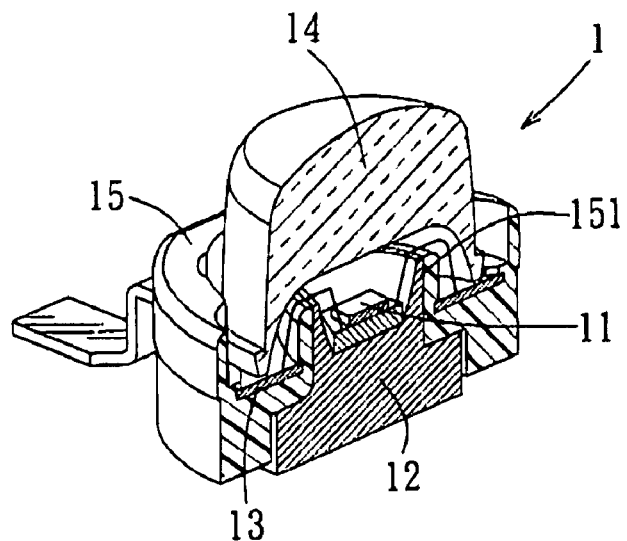
FIG. 1 is a sectional view of a conventional light emitting diode packaging device.

Before the present invention is described in greater detail with reference to the accompanying preferred embodiments, it should be noted herein that like elements are denoted by the same reference numerals throughout the disclosure.

Figure 2:
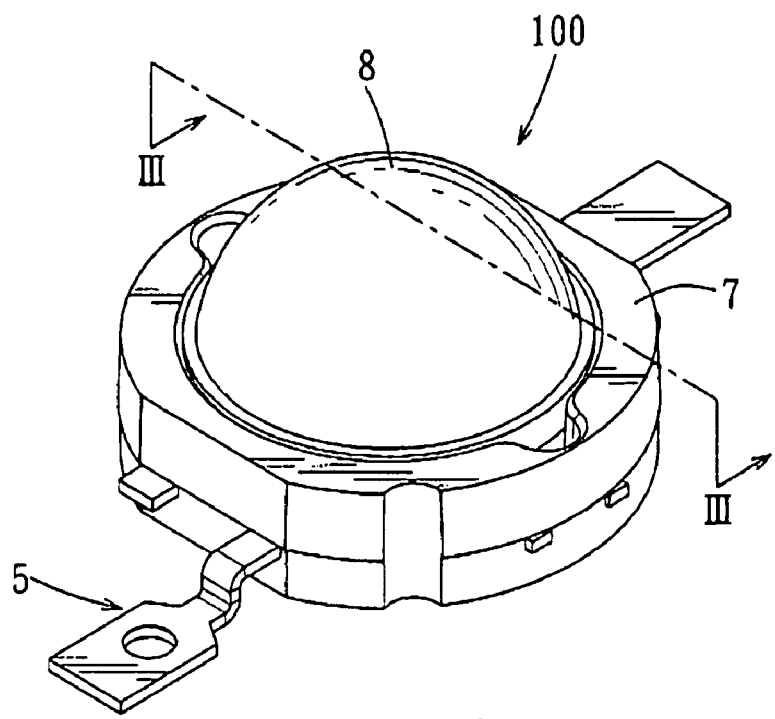
FIG. 2 is a perspective view of the first preferred embodiment of a light emitting diode packaging device according to this invention.
Figure 3:
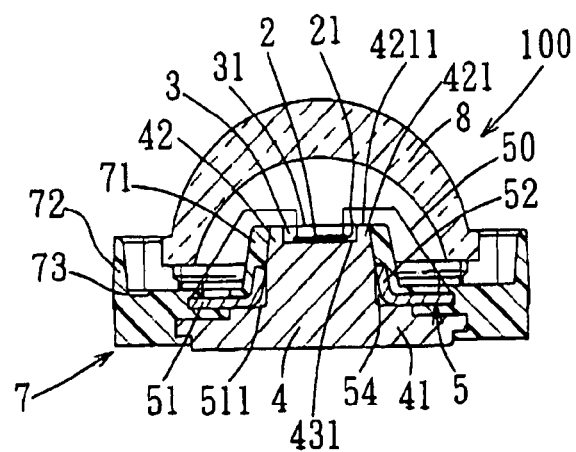
FIG. 3 is a sectional view taken from line III-III in FIG. 2.
Figure 4:
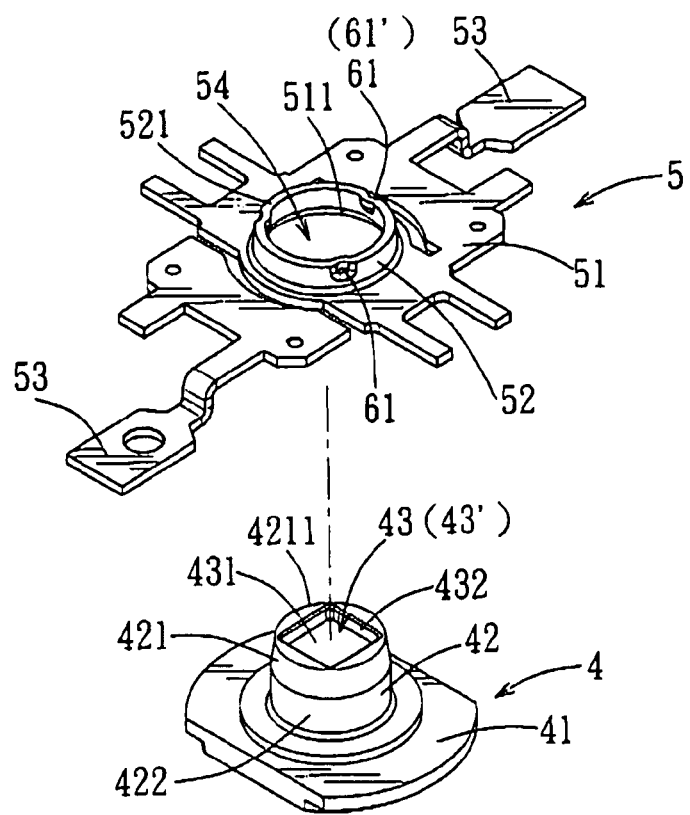
FIG. 4 is an exploded perspective view of an assembly of a lead frame and a heat dissipating base of the first preferred embodiment.

FIGS. 2 to 4 illustrate the first preferred embodiment of a light emitting diode packaging device 100 according to the present invention. The light emitting diode packaging device 100 includes: a heat dissipating base 4 having a dice-mounting surface 431 and a protruding part 42 protruding therefrom; a light emitting dice 2 mounted on the dice-mounting surface 431 of the heat dissipating base 4; a lead frame 5 coupled electrically to the light emitting dice 2 through a pair of wires 50 and having a base wall 51 formed with a through-hole 511 for extension of the protruding part 42 of the heat dissipating base 4 therethrough, and a protruding wall 52 protruding from a periphery of the through-hole 511 and defining a confining space 54 for extension of the protruding part 42 of the heat dissipating base 4 therethrough; at least one retaining member 61 provided on one of the protruding part 42 of the heat dissipating base 4 and the protruding wall 52 of the lead frame 5 to retain the lead frame 5 to the heat dissipating base 4 (in this embodiment, three equiangularly disposed retaining members 61 are formed on the protruding wall 52 of the lead frame 5); and a molding material 7 molded on the heat dissipating base 4 and the lead frame 5.

The heat dissipating base 4 is made from a highly thermal conductive material selected from the group consisting of Cu, Mo, W, Al, Si, Cr, alloys thereof, aluminum nitride, and aluminum oxide.

The protruding wall 52 of the lead frame 5 has a free open end 521 distal from the base wall 51. The protruding part 42 of the heat dissipating base 4 has an end portion 421 extending through the free open end 521 of the protruding wall 52. The molding material 7 encloses the protruding wall 52 of the lead frame 5 and the end portion 421 of the protruding part 42 of the heat dissipating base 4.

Figure 5:
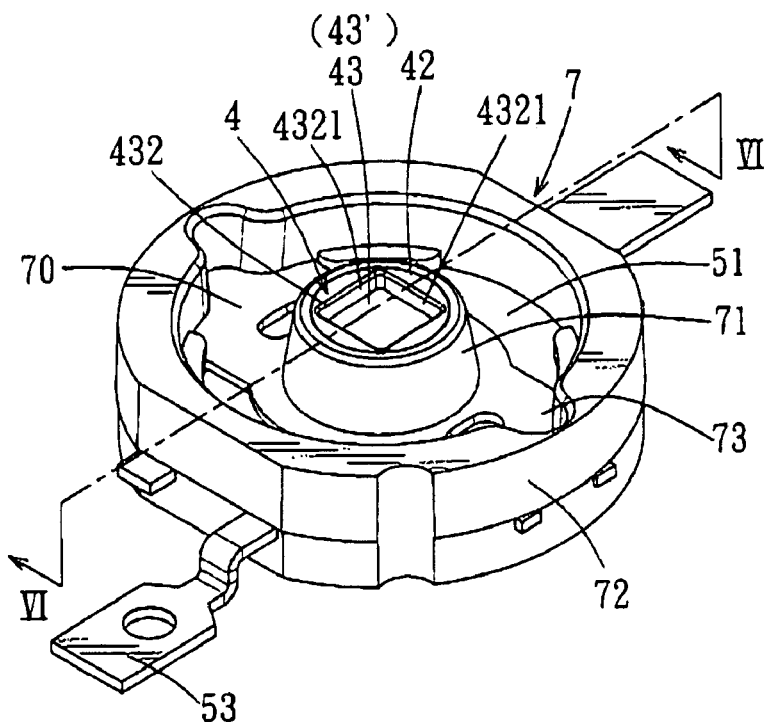
FIG. 5 is an assembled perspective view of the assembly of FIG. 4.
Figure 6:
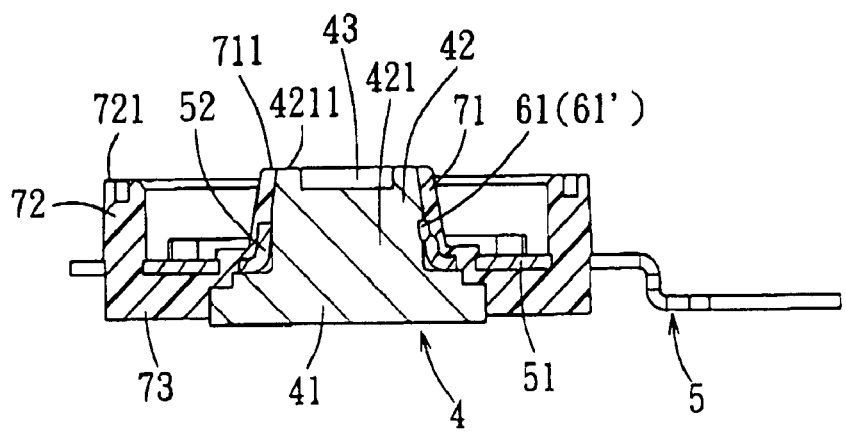
FIG. 6 is a sectional view taken from line VI-VI in FIG. 5.

In this embodiment, the protruding wall 52 of the lead frame 5 is formed with three abutting protrusions 61' that respectively define the retaining members 61 and that protrude therefrom to abut against the protruding part 42 of the heat dissipating base 4 (see FIG. 6). The base wall 51 and the protruding wall 52 of the lead frame 5 are an integrally punched piece and are formed by punching a metal sheet. The abutting protrusions 61' are formed through the punching operation. The lead frame 5 further has a pair of legs 53 (see FIGS. 4 and 5) disposed outwardly of the molding material 7 for connection to an external circuit (not shown).

The heat dissipating base 4 further has a base part 41. The protruding part 42 of the heat dissipating base 4 is substantially cylindrical in shape, and further has a root portion 422 extending from the base part 41 to the end portion 421 of the protruding part 42. The base part 41 of the heat dissipating base 4 is enlarged in cross-section from the root portion 422 of the protruding part 42. The periphery of the through-hole 511 in the base wall 51 of the lead frame 5 is seated on the base part 41 of the heat dissipating base 4.

The end portion 421 of the protruding part 42 of the heat dissipating base 4 is formed with a dice-mounting recess 43 defined by a recess-defining wall 43' (see FIG. 4). The recess-defining wall 43' has the dice-mounting surface 431 and a surrounding surface 432 extending from a periphery of the dice-mounting surface 431 and having a plurality of sides 4321 (see FIG. 5). The light emitting dice 2 is mounted in the dice-mounting recess 43, and has a plurality of lateral sides 21 (see FIG. 3) that are respectively parallel to the sides 4321 of the surrounding surface 432 of the recess-defining wall 43'.

A fluorescent material 3 (see FIG. 3) fills in the dice-mounting recess 43 in the end portion 421 of the protruding part 42 of the heat dissipating base 4, and encloses the light emitting dice 2. In this embodiment, the end portion 421 of the protruding part 42 of the heat dissipating base 4 has an end face 4211 distal from the base wall 51 of the lead frame 5. The fluorescent material 3 extends from the dice-mounting surface 431, and has an upper surface 31 distal from the dice-mounting surface 431. The upper surface 31 of the fluorescent material 3 has a level relative to the base wall 51 of the lead frame 5 not less than that of the end face 4211 of the end portion 421 of the protruding part 42 of the heat dissipating base 4.

The molding material 7 has a base segment 73 (see FIGS. 3 and 5) and inner and outer projecting segments 71, 72 projecting from the base segment 73 and disposed co-axially to define a gap 70 therebetween. The inner projecting segment 71 encloses the protruding wall 52 of the lead frame 5 and the end portion 421 of the protruding part 42 of the heat dissipating base 4, and has an end face 711 (see FIG. 6) that is distal from the base segment 73. The end face 711 of the inner projecting segment 71 has a level relative to the base wall 51 of the lead frame 5 not greater than that of the end face 4211 of the end portion 421 of the protruding part 42 of the heat dissipating base 4. The outer projecting segment 72 has an end face 721 (see FIG. 6) that is distal from the base segment 73. The end face 721 of the outer projecting segment 72 has a level relative to the base wall 51 of the lead frame 5 less than that of the end face 4211 of the end portion 421 of the protruding part 42 of the heat dissipating base 4.

A lens 8 is connected to the outer projecting segment 72 to enclose the inner projecting segment 71 and the gap 70 between the inner and outer projecting segments 71, 72.

Figure 7:
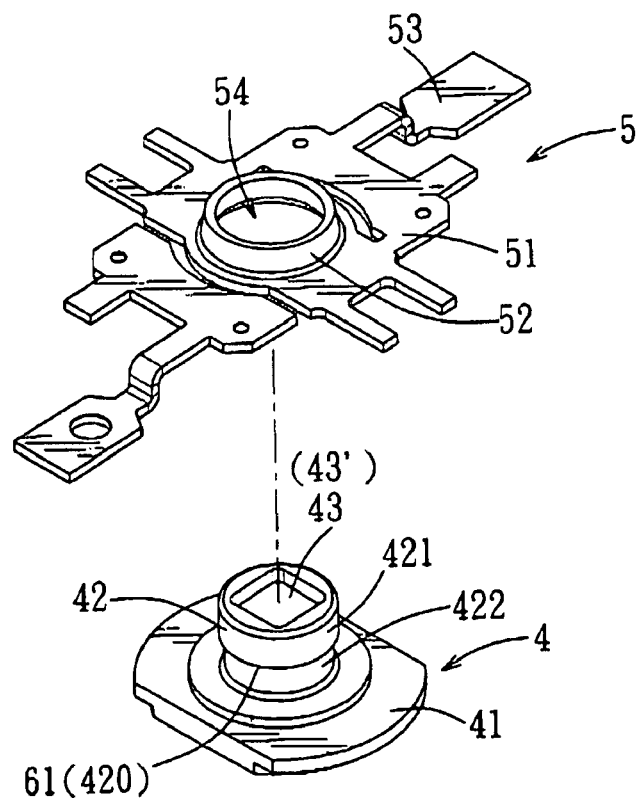
FIG. 7 is an exploded perspective view of the assembly of the lead frame and the heat dissipating base of the second preferred embodiment.
Figure 8:
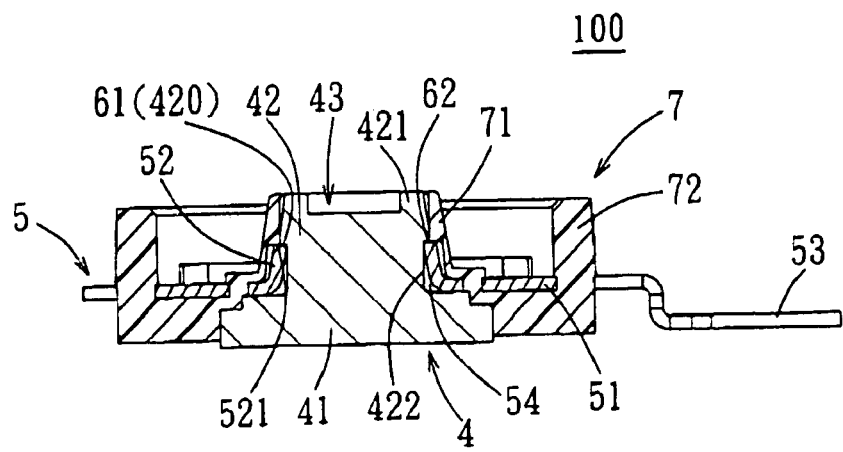
FIG. 8 is a sectional view of the second preferred embodiment.

FIGS. 7 and 8 illustrate the second preferred embodiment of the light emitting diode packaging device 100 according to this invention. The second preferred embodiment differs from the previous embodiment in that the end portion 421 of the protruding part 42 is enlarged in cross-section from the root portion 422 of the protruding part 42 to define a neck 420 therebetween. The neck 420 defines the retaining member 61, and is anchored on the free open end 521 of the protruding wall 5 of the lead frame 5 so as to prevent undesired separation of the heat dissipating base 4 from the lead frame 5.

The method for making an assembly of the heat dissipating base 4 and the lead frame 5 of the light emitting diode packaging device 100 includes the steps of: (a) preparing the heat dissipating base 4 having the structure as shown in FIG. 4 or FIG. 7; (b) punching a metal sheet into the lead frame 5 having the structure shown in FIG. 4 or FIG. 7; (c) inserting the protruding part 42 of the heat dissipating base 4 into and through the confining space 54 defined by the protruding wall 52 of the lead frame 5 and retaining the lead frame 5 to the heat dissipating base 4 through the retaining member(s) 61; and (d) injection molding the lead frame 5 and the heat dissipating base 4 using a resin so as to form the molding material 7 bonded adhesively to and enclosing the protruding wall 52 of the lead frame 5 and the end portion 421 of the protruding part 42 of the heat dissipating base 4.

With the inclusion of the retaining member(s) 61 in the assembly of the heat dissipating base 4 and the lead frame 5 of the light emitting diode packaging device 100 of this invention, and by molding over both the heat dissipating base 4 and the lead frame 5 after they are firmly connected through the retaining member(s) 61, the aforesaid drawback associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light emitting diode packaging device comprising:
    a heat dissipating base having a dice-mounting surface and a protruding part protruding therefrom;
    a light emitting dice mounted on said dice-mounting surface of said heat dissipating base;
    a lead frame coupled electrically to said light emitting dice and having a base wall formed with a through-hole for extension of said protruding part of said heat dissipating base coaxially therethrough, and a protruding wall protruding from a periphery of said through-hole and defining a confining space for extension of said protruding part of said heat dissipating base therethrough;

at least one retaining member provided on one of said protruding part of said heat dissipating base and said protruding wall of said lead frame to retain said lead frame in locked engagement with said heat dissipating base; and a molding material molded on said heat dissipating base and said lead frame.

2. The light emitting diode packaging device of claim 1, wherein said protruding wall of said lead frame has a free open end distal from said base wall, said protruding part of said heat dissipating base having an end portion extending through said free open end of said protruding wall, said molding material enclosing said protruding wall of said lead frame and said end portion of said protruding part of said heat dissipating base.

3. The light emitting diode packaging device of claim 2, wherein said protruding wall of said lead frame is formed with at least one abutting protrusion that defines said retaining member and that protrudes therefrom to abut against said protruding part of said heat dissipating base.

4. The light emitting diode packaging device of claim 3, wherein said base wall and said protruding wall of said lead frame are an integrally punched piece.

5. The light emitting diode packaging device of claim 2, wherein said heat dissipating base further has a base part, said protruding part of said heat dissipating base further having a root portion extending from said base part, said end portion of said protruding part being enlarged in cross-section from said root portion of said protruding part to define a neck therebetween, said neck defining said retaining member and being anchored on said free open end of said protruding wall of said lead frame.

6. The light emitting diode packaging device of claim 5, wherein said base part of said heat dissipating base is enlarged in cross-section from said root portion of said protruding part, the periphery of said through-hole in said base wall of said lead frame being seated on said base part of said heat dissipating base.

7. The light emitting diode packaging device of claim 2, wherein said end portion of said protruding part of said heat dissipating base is formed with a dice-mounting recess defined by a recess-defining wall, said recess-defining wall having said dice-mounting surface and a surrounding surface extending from a periphery of said dice-mounting surface and having a plurality of sides, said light emitting dice being mounted in said dice-mounting recess and having a plurality of lateral sides that are respectively parallel to said sides of said surrounding surface of said recess-defining wall.

8. The light emitting diode packaging device of claim 7, further comprising a fluorescent material filling in said dice-mounting recess in said end portion of said protruding part of said heat dissipating base and enclosing said light emitting dice.

9. A light emitting diode packaging device of comprising:

a heat dissipating base having a dice-mounting surface and a protruding part protruding therefrom;

a light emitting dice mounted on said dice-mounting surface of said heat dissipating base;

a lead frame coupled electrically to said light emitting dice and having a base wall formed with a through-hole for extension of said protruding part of said heat dissipating base therethrough, and a protruding wall protruding from a periphery of said through-hole and defining a confining space for extension of said protruding part of said heat dissipating base therethrough;

at least one retaining member provided on one of said protruding part of said heat dissipating base and said protruding wall of said lead frame to retain said lead frame to said heat dissipating base; and a molding material molded on said heat dissipating base and said lead frame;

wherein said protruding wall of said lead frame has a free open end distal from said base wall, said protruding part of said heat dissipating base having an end portion extending through said free open end of said protruding wall, said molding material enclosing said protruding wall of said lead frame and said end portion of said protruding part of said heat dissipating base;

wherein said end portion of said protruding part of said heat dissipating base is formed with a dice-mounting recess defined by a recess-defining wall, said recess-defining wall having said dice-mounting surface and a surrounding surface extending from a periphery of said dice-mounting surface and having a plurality of sides, said light emitting dice being mounted in said dice-mounting recess and having a plurality of lateral sides that are respectively parallel to said sides of said surrounding surface of said recess-defining wall;

wherein a fluorescent material fills in said dice-mounting recess in said end portion of said protruding part of said heat dissipating base and encloses said light emitting dice; and, wherein said end portion of said protruding part of said heat dissipating base has an end face distal from said base wall of said lead frame, said fluorescent material extending from said dice-mounting surface and having an upper surface distal from said dice-mounting surface, said upper surface of said fluorescent material having a level relative to said base wall of said lead frame not less than that of said end face of said end portion of said protruding part of said heat dissipating base.

10. The light emitting diode packaging device of claim 2, wherein said end portion of said protruding part of said heat dissipating base has an end face distal from said base wall of said lead frame, said molding material having a base segment and inner and outer projecting segments projecting from said base segment and disposed co-axially, said inner projecting segment enclosing said protruding wall of said lead frame and said end portion of said protruding part of said heat dissipating base and having an end face that is distal from said base segment, said end face of said inner projecting segment having a level relative to said base wall of said lead frame not greater than that of said end face of said end portion of said protruding part of said heat dissipating base, said outer projecting segment having an end face that is distal from said base segment, said end face of said outer projecting segment having a level relative to said base wall of said lead frame less than that of said end face of said end portion of said protruding part of said heat dissipating base.

11. The light emitting diode packaging device of claim 2, further comprising a lens, said molding material having a base segment and inner and cuter projecting segments projecting from said base segment and disposed co-axially to define a gap therebetween, said inner projecting segment enclosing said protruding wall of said lead frame and said end portion of said protruding part of said heat dissipating base, said lens being connected to said outer projecting segment to enclose said inner projecting segment and said gap.

12. The light emitting diode packaging device of claim 1, wherein said heat dissipating base is made from a material selected from the group consisting of Cu, Mo, W, Al, Si, Cr, alloys thereof, aluminum nitride, and aluminum oxide.

13. An assembly of a heat dissipating base and a lead frame for a light emitting diode packaging device, comprising:

a heat dissipating base having a protruding part protruding therefrom;

a lead frame having a base wall formed with a through-hole for extension of said protruding part of said heat dissipating base coaxially therethrough, and a protruding wall protruding from a periphery of said through-hole and defining a confining space for extension of said protruding part of said heat dissipating base therethrough;

at least one retaining member provided on one of said protruding part of said heat dissipating base and said protruding wall of said lead frame to retain said lead frame in locked engagement with said heat dissipating base; and a molding material molded on said heat dissipating base and said lead frame.

14. The assembly of claim 13, wherein said protruding wall of said lead frame has a free open end distal from said base wall, said protruding part of said heat dissipating base having an end portion extending through said free open end of said protruding wall, said molding material enclosing said protruding wall of said lead frame and said end portion of said protruding part of said heat dissipating base.

15. The assembly of claim 14, wherein said protruding wall of said lead frame is formed with at least one abutting protrusion that defines said retaining member and that protrudes therefrom to abut against said protruding part of said heat dissipating base.

16. The assembly of claim 15, wherein said base wall and said protruding wall of said lead frame are an integrally punched piece.

17. The assembly of claim 14, wherein said heat dissipating base further has a base part, said protruding part of said heat dissipating base further having a root portion extending from said base part, said end portion of said protruding part being enlarged in cross-section from said root portion of said protruding part to define a neck therebetween, said neck defining said retaining member and being anchored on said free open end of said protruding wall of said lead frame.

18. The assembly of claim 17, wherein said base part of said heat dissipating base is enlarged in cross-section from said root portion of said protruding part, the periphery of said through-hole in said base wall of said lead frame being seated on said base part of said heat dissipating base.

19. The assembly of claim 14, wherein said end portion of said protruding part of said heat dissipating base has an end face distal from said base wall of said lead frame, said molding material having a base segment and inner and outer projecting segments projecting from said base segment and disposed co-axially, said inner projecting segment enclosing said protruding wall of said lead frame and said end portion of said protruding part of said heat dissipating base and having an end face that is distal from said base segment, said end face of said inner projecting segment having a level relative to said base wall of said lead frame not greater than that of said end face of said end portion of said protruding part of said heat dissipating base, said outer projecting segment having an end face what is distal from said base segment, said end face of said outer projecting segment having a level relative to said base wall of said lead frame less than that of said end face of said end portion of said protruding part of said heat dissipating base.

* * * * *